United States Patent [19]

Hickman

[11] Patent Number: 5,795,849
[45] Date of Patent: Aug. 18, 1998

[54] BULK CERAMIC SUPERCONDUCTOR STRUCTURES

[76] Inventor: Paul L. Hickman, P.O. Box 391837, Mtn. View, Calif. 94039-1837

[21] Appl. No.: 477,671

[22] Filed: Jun. 7, 1995

Related U.S. Application Data

[62] Division of Ser. No. 49,628, Apr. 19, 1993, abandoned, which is a division of Ser. No. 418,786, Oct. 3, 1989, abandoned, which is a continuation of Ser. No. 136,008, Dec. 21, 1987, abandoned.

[51] Int. Cl.$^6$ .................................................. H01L 39/24
[52] U.S. Cl. ................... 505/329; 505/234; 505/237; 505/238; 505/470; 505/725; 427/62
[58] Field of Search .......................... 505/234, 237, 505/238, 230, 329, 330, 470, 725; 427/62, 63

[56] References Cited

U.S. PATENT DOCUMENTS

| | | | |
|---|---|---|---|
| 3,251,715 | 5/1966 | Miles et al. | 117/212 |
| 3,352,007 | 11/1967 | Charles | 29/599 |
| 3,449,092 | 6/1969 | Hammond | 29/194 |
| 3,534,459 | 10/1970 | Kudo et al. | 29/194 |
| 3,593,413 | 7/1971 | Kafka | 29/599 |
| 3,625,662 | 12/1971 | Roberts et al. | 29/191.6 |
| 4,316,785 | 2/1982 | Suzuki et al. | 427/62 |
| 4,430,662 | 2/1984 | Jillie, Jr. et al. | 357/5 |
| 4,797,510 | 1/1989 | Mihelich | 174/94 |
| 4,826,808 | 5/1989 | Yurek et al. | 505/1 |
| 4,828,931 | 5/1989 | Ogawa et al. | 428/596 |
| 4,849,288 | 7/1989 | Schmaderer et al. | 428/366 |
| 4,861,751 | 8/1989 | Tenhover | 505/1 |
| 4,886,776 | 12/1989 | Early et al. | 505/1 |
| 4,908,346 | 3/1990 | Strom et al. | 505/1 |
| 4,918,050 | 4/1990 | Dworsky | 505/1 |
| 4,921,833 | 5/1990 | Takano | 505/1 |
| 4,952,554 | 8/1990 | Jin et al. | 505/1 |
| 4,954,480 | 9/1990 | Imanaka et al. | 505/1 |
| 4,975,411 | 12/1990 | Danby et al. | 505/1 |
| 5,041,420 | 8/1991 | Nagesh et al. | 505/1 |

OTHER PUBLICATIONS

Kishio, Kohji et al., "Effect of Residual Water on Superconductivity in $(La_{1-x}Sr_x)_2CuO_{4-\delta}$," Japanese Journal of Applied Physics, vol. 26, No. 4, Apr. 1987, pp. L466–L467.

Chu, C.W. et al., "Evidence for Superconductivity above 40 K in the La–Ba–Cu–O Compound System," Physical Review Letters, vol. 58, No. 4, Jan. 26, 1987, pp. 405–407.

Uchida, Shin-ichi et al., "High $T_c$ Superconductivity of La–Ba–Cu Oxides," Japanese Journal of Applied Physics, vol. 26, No. 1, Jan. 1987, pp. L1–L2.

Koinuma, Hideomi et al., "High $T_c$ Superconductivity in Screen Printed Yb–Ba–Cu–O Films," Dept. of Industrial Chemistry, Apr. 25, 1987.

Cava, R.J. et al., "Bulk Superconductivity at 36 K in $La_{1.8}Sr_{0.2}CuO_4$," Physical Review Letters, vol. 58, No. 4, Jan. 26, 1987.

(List continued on next page.)

*Primary Examiner*—Roy V. King

[57] ABSTRACT

A method for producing a superconductor assembly includes preparing a first bulk ceramic superconductor having a first essentially random pattern of superconductor domains of a copper-oxide ceramic superconductor and non-superconductor domains at a critical temperature, and preparing a second bulk ceramic superconductor having a second essentially random pattern of superconductor domains of a copper-oxide ceramic superconductor and non-superconductor domains at the critical temperature. The method further includes juxtaposing a first surface of the first bulk ceramic superconductor proximate with a first surface of the second bulk ceramic superconductor to form a superconductor assembly where superconductor domains of the first bulk ceramic superconductor and superconductor domains of the second bulk ceramic superconductor are only randomly aligned due to the different first essentially random pattern and second essentially random pattern. The bulk layers can be attached together by a number of techniques, including sintering, using an adhesive, or providing a conductive or non-conductive interlayer.

28 Claims, 1 Drawing Sheet

OTHER PUBLICATIONS

Bednorz, J.G. et al., "Possible High $T_c$ Superconductivity in the Ba–La–Cu–o System," Condensed Matter 1986, pp. 189–193.

Koinuma, Hideomi et al., "Preparation of $(La_{1-x}Sr_x)_2CuO_{4-\delta}$ Superconducting Films by Screen Printing Method," Dept. of Industrial Chemistry, Mar. 23, 1987, pp. L399–L401.

Saito, Yashitami et al., "Composition Dependence of the High Temperature Superconductivity in (Ba,Sr)–La–(Hg, Ag)–Cu–O System with $K_2NiF_4$–Type Structure," Japanese Journal of Applied Physics, vol. 26, No. 3, Mar. 1987, pp. L223–L224.

Koinuma, Hideomi et al., "Some Problems in the Preparation of Superconducting Oxide Films on Ceramic Substrates," Japanese Journal of Applied Physics, vol. 26, No. 5, May 1987, pp. L763–L765.

Nakajima, H. et al., "Interdiffusion and Interfacial Reaction Between a $YBa_2Cu_3O_x$ Thin Film and Substrates," App. Phys. Lett. Oct. 1988, pp. 1437–1439.

Sun, J.Z. et al., "Superconductivity and Magnetism in the High-Tc Superconductor YBaCuO," Dept. of Applied Physics, Stanford University, pp. 1–7.

Wu, M.K. et al., "Superconductivity at 93 K in a New Mixed-Phase Y–Ba–Cu–O Compound System at Ambient Pressure," Physical Review Letters, vol. 58, No. 9, Mar. 2, 1987, pp. 908–910.

Saito, Yoshitami et al., "Superconductivity of Sr–La–Cu Oxides Prepared by Coprecipitation Method," Japanese Journal of Applied Physics, vol. 26, No. 5, May 1987, pp. L836–L837.

Saito, Yoshitami et al., "Composition Dependence of Superconductivity in Y–Ba–(Ag,Cu)–O System," Japanese Journal of Applied Physics, vol. 26, No. 5, May 1987, pp. L832–L833.

Capone II, D.W. et al., "Super Critical Fields and High Superconducting Transition Temperatures of $La_{1.85}Sr_{0.15}CuO_4$ and $La_{1.85}Ba_{0.15}CuO_4$", App. Phys. Lett. 50 (9) Mar. 2, 1987, pp. 543–544.

Jin et al., "High Tc superconductors—composite wire fabrication", 20 Jul. 1987, Appl. Phys. Lett. 51(3), American Institute of physics. pp. 20–21.

Nelson et al., "Chemistry of High-Temerature Superconductors II", Ch. 1, pp. 1–11, Sep. 25–30, 1988, Symposium of American Chemical Society.

Tsuei, C.C., "Josephson Superconductive Devices," IBM Technical Disclosure Bulletin Feb. 1975, vol. 17, No. 9, pp. 2796–2797.

Sahu et al., "Overview of High–Temperature Superconductivity," ACS Symposium Series, 1988 American Chemical Society, Chapter 1.

Johnson, D.W. et al., "Fabrication of Ceramic Articles from High $T_0$ Superconducting Oxides," 1987 Advanced Ceramic Materials, vol. 2, No. 3B, pp. 364–371.

"Cuprate Superconductors Record 133 K Achieved with Mercury," May 10, 1993 C&EN, pp. 4–5.

Geballe, Theodore H., "Paths to Higher Temperature Superconductors," Science, Mar. 12, 1993, vol. 259, pp. 1550–1551.

"Is the Train of the Future About To Pull In?" Science & Technology, Business Week, Nov. 16, 1987, pp. 150.

BULK CERAMIC SUPERCONDUCTOR STRUCTURES

This is a divisional of application Ser. No. 08/049,628 filed on Apr. 19, 1993, now abandoned, which is a divisional of application Ser. No. 07/418,786, filed Oct. 3, 1989, now abandoned, which was a continuation of Ser. No. 07/136,008 filed Dec. 21, 1987, now abandoned.

BACKGROUND OF THE INVENTION

1. Field of the Invention

This invention relates generally to superconductors, and more particularly to the new class of high $T_c$ ceramic superconductors.

2. Description of the Related Art

The phenomenon of superconductivity was discovered by K. H. Onnes in 1911 when he demonstrated that the electrical resistance of mercury drops to zero when it is cooled to approximately 4 Kelvins (K) above absolute zero temperature. For many years the phenomenon remained a scientific curiosity, with few practical uses.

Theoretically, superconductivity has many potential applications. For example, superconducting power lines could save a great deal of energy that would otherwise be dissipated during transmission. Small and extremely powerful superconducting magnets, generators, and motors could be built. Superconducting devices known as Josephson junctions are extremely fast electronic switches having very low power consumption. In fact, the potential uses for superconducting materials are so many and varied, that an attempt to make a comprehensive list of possible applications is almost an exercise in futility.

Despite the potential benefits of superconducting devices and structures, in the past they were seldom found outside of research laboratories because it was too expensive to cool most materials to their superconducting transition temperature $T_c$. This was due to the fact that, prior to early 1987, all known superconductor materials had a transition temperature within a few dozen degrees Kelvin of absolute zero, requiring the use of expensive liquid helium cooling systems.

On Mar. 2, 1987, M. K. Wu et al. published a paper entitled "Superconductivity at 93 K in a New Mixed-Phase Y—Ba—Cu—O Compound System at Ambient Pressure" in Physical Review Letters, Volume 58, Number 9. This announcement caused considerable excitement in the scientific and business communities because, for the first time, a superconductor material had been discovered which could use liquid nitrogen as a coolant. Since liquid nitrogen cooling systems are at least an order of magnitude less expensive than liquid helium cooling systems, many applications for superconductors suddenly became practical after the discovery of these new superconductor materials.

Beside having zero electrical resistance, superconductors exhibit the so-called Meissner effect which cause a superconductor to expel magnetic fields. This phenomenon is the basis for superconducting magnetic levitation where a magnet is levitated above a superconducting surface, or vice-versa. A practical use for magnetic levitation is in the manufacture of high-speed, magnetically levitated trains, which are expected to be more economical than other forms of transportation for medium-distance journeys.

This magnetic repulsion appears to be a surface-related phenomenon. When a surface is uniformly superconducting, as is the case with metallic superconductors such as mercury, lead, and niobium, a magnetic field can penetrate into the superconductor only a very small distance (the magnitude of which is related to its magnetic field strength), before being repelled by the superconductor.

A problem with using the newly discovered ceramic superconductors for magnetic levitation is that, in bulk, they tend not to be single crystal, i.e. having a single, repeating superconducting lattice structure. Instead, bulk superconductor typically includes many small superconductor grains bonded together with non-superconductor materials. In consequence, magnetic field lines can penetrate the interstices between superconductor grains, reducing magnetic reflection and therefore the amount of possible magnetic levitation.

Even if ceramic superconductors are produced in an attempt to form single crystals by, for example, sputtering or evaporative techniques, there is a good chance that the crystals, in bulk, would contain a great number of lattice defects as well as localized non-superconducting domains resulting in areas of non-superconductivity. Therefore, the problem remains of how to produce a ceramic superconductor material which overcomes the problem of localized non-superconductor regions so as to enhance the superconductor's ability to repel a magnetic field.

Non-superconducting regions also limit the amount of current that can be carried by these ceramic superconductors. In general, as the percentage of non-superconducting domains increases, the critical current $I_c$ above which the superconductivity of the material is quenched, decreases. Therefore, another problem encountered in trying to make bulk ceramic superconductors is how to increase their critical current level.

SUMMARY OF THE INVENTION

It is an object of this invention to increase the magnetic shielding and reflecting properties of ceramic superconductors.

Another object of this invention is to provide multiple superconducting paths within a ceramic superconductor.

Briefly, the method of the present invention is to manufacture a superconducting material in multiple layers. Each layer has its own pattern of superconductor and non-superconductor domains. When the layers are juxtaposed, their patterns often complement such that a non-superconductor domain of one layer is at least partially covered by a superconductor domain of another, thereby decreasing magnetic permeability. In general, the magnetic shielding effect is increased by increasing the number of superconductor layers and by reducing the thickness of each individual layer.

The multi-layer superconductor structure of the present invention can also improve the current-carrying capabilities of the superconductor if superconductor pathways are provided between adjacent superconductor layers. Such pathways can be provided by sintering adjacent layers together, or by providing a low-energy pathway between adjacent layers.

An advantage of this invention is that the magnetic reflective and current carrying capabilities of ceramic superconductors can be greatly increased.

Another advantage of this invention is that its implementation does not require exotic or expensive techniques, machinery, or instrumentation.

These and other objects and advantages of the present invention will no doubt become apparent upon a reading of the following detailed descriptions and a study of the various figures of the drawing.

DETAILED DESCRIPTION OF THE PREFERRED EMBODIMENTS

Figure 1:
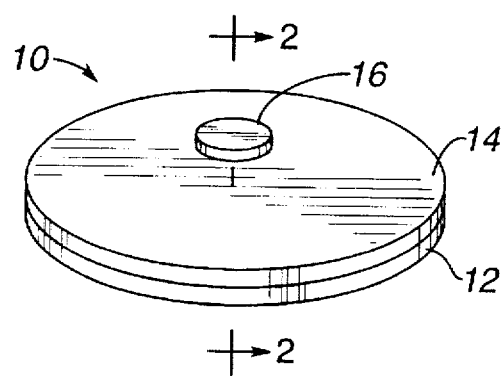
FIG. 1 is a perspective view of a multi-layer superconductor in accordance with the present invention.

With reference to FIG. 1, a multi-layer superconductor structure 10 in accordance with the present invention includes a first layer 12 and a second layer 14. A small magnet 16 will float above the surface of the superconductor structure 10 due to the well-documented Meissner effect when the superconductor structure is cooled below its critical temperature $T_c$.

First layer 12 and second layer 14 can be made from a ceramic superconductor substance such as $Y_1Ba_2Cu_3O_x$ (hereinafter "YBaCuO") that was reported by Wu et al., supra. However, it should be apparent to those skilled in the art that the methods and structures described herein could be practiced with a wide variety of ceramic superconducting materials, many of which are yet to be discovered.

As used and claimed herein, the term "ceramic superconductor" will mean a superconductor having some type of repeating lattice structure regions, i.e. any non-amorphous, non-metallic superconductor material. It is likely that, as technology evolves, other superconductor materials that would not be classically defined as "ceramic" will be discovered. However, as long as those superconductor materials have crystal or lattice structures, bulk amounts of those new superconductor materials will have crystal defects and non-superconducting domains, and their magnetic and superconducting properties will be helped by the methods and structures of this invention.

YBaCuO is typically prepared from mixtures of high purity $Y_2O_3$, $BaCO_3$, and $CuO$ powders. The powders are thoroughly mixed and then heated for a number of hours at 750°–850° C. in an oxidizing atmosphere to drive off the carbon, resulting in a powder including black and dark green components. The powder can be pressed into a desired shape, such as the disk shapes of layers 12 and 14, or it can be left in its powdered form. The powder or disks are then additionally heated for a number of hours at a somewhat higher temperature of 850°–950° C. in an oxidizing atmosphere until the material turns entirely black. A detailed explanation of the method steps involved in the manufacture of superconducting YBaCuO and a description of some of its properties can be found in a paper entitled "Superconductivity and Magnetism in High-$T_c$ Superconductor YBaCuO", J. Z. Sun, et al., Department of Applied Physics, Stanford University, PACS #: 74.30.-E, 74.70.-B.

Superconductor materials created by the method described above are by no means pure. In fact, it has been estimated that the described method produces only 30–50% superconductor phase, the remainder being non-superconductor phases. This is due to the crudeness of the process including gross mechanical mixing of the various chemicals, and uncontrolled crystallization of the materials.

With the above-described process, the superconductor phase tends to form superconductor domains or grains which sinter with adjacent superconductor and non-superconductor domains or grains. The interstices between the grains of the superconductor material fill with a cement-like non-superconductor phase. Each superconductor made by the bulk process described above will have its own unique pattern of superconductor and non-superconductor domains.

Adjacent superconductor domains that are separated by thin, non-superconductor layers can act as Josephson junctions. It is believed that superconduction over lengths considerably greater that the average size of the superconducting domains is accomplished by Josephson-type electron-pair tunneling between adjacent superconductor domains in the material. However, if a non-superconductor layer is too thick, the superconducting electron-pairs will not be able to tunnel through it, and superconduction will be blocked in that direction.

Figure 2:
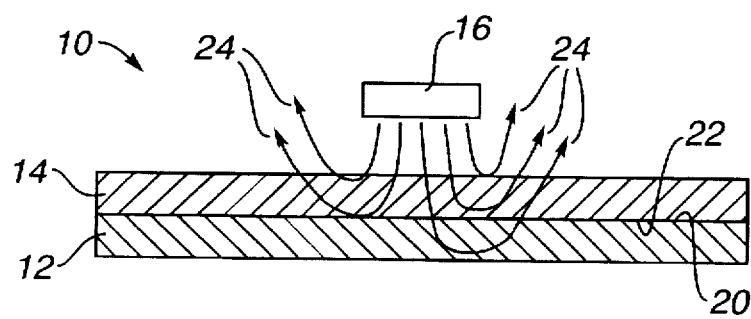
FIG. 2 is a cross-sectional view taken along line 2—2 FIG. 1.

With reference to FIG. 2, the two layers 12 and 14 are juxtaposed with a first surface 20 of layer 12 facing a second surface 22 of layer 14. Because the pattern of superconductor and non-superconductor domains in layers 12 and 14 are essentially random, there is little likelihood of substantial alignment of the domains of the two layers. As such, there is a good probability that a non-superconductor domain of one of the layers will be covered by a superconductor domain of the other layer.

This misalignment of the superconductor domains of the multi-layer superconductor structure increases the magnetic shielding and reflecting capabilities of the structure. As an example, magnet 16 is shown emitting a number of flux lines 24, some of which penetrate the superconductor structure 10 until they contact a superconducting surface to be reflected from. As such, if a particular flux line 24 completely penetrates layer 14, chances are that it will be reflected by a superconductor surface of layer 12. In consequence, the magnetic permeability of superconductor structure 10 is decreased and its magnetic shielding and reflecting properties are increased.

Furthermore, if there are superconducting paths between layers 12 and 14, such as Josephson-type junctions between superconducting domains in surfaces 20 and 22, respectively, the multi-layer superconductor structure 10 can increase the current carrying capacity of the superconductor. As will be discussed in greater detail subsequently, such paths can be created by sintering surfaces 20 and 22 together, or by providing a low-energy paths between layers 12 and 14 by providing non-insulating inter-layers or vias.

Figure 3:
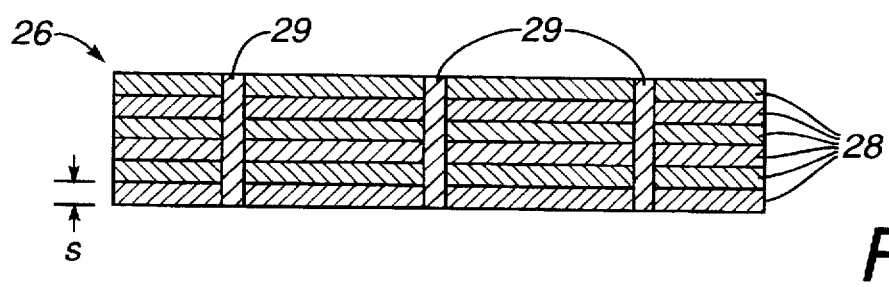
FIG. 3 is a cross-sectional view of an alternate embodiment of a multi-layer superconductor in accordance with the present invention.

Referring now to FIG. 3, a multi-layer superconductor structure 26 includes a number of superconductor layers 28, each of which has its own unique pattern of superconducting domains and non-superconducting domains. Taken as a whole, the structure 26 has very low magnetic permeability and, thus, very high magnetic reflection.

The magnetic reflection appears to increase not only with the number of layers 28, but also with the thinness "s" of each individual layer. This may be a result of the fact that as the layers 28 become thinner, superconducting surfaces are brought closer together, thereby reducing magnetic permeability.

The current carrying capability of superconductor structure 26 is also enhanced by increasing the number of layers 28. While it has been reported that YBaCuO (and other superconductors in its class) are highly anisotropic, the superconductor grains tend to be somewhat randomly oriented, giving no clearly superior superconducting path. By providing multiple layers 28, the chance that a path in a desired direction can be found increases, thereby increasing the current carrying capabilities in that direction.

Superconduction between the layers can be enhanced by the addition of vias 29 made from non-insulating materials such as superconductors, conductors, and semi-conductors. If the vias were made from a good conductor, such as copper or silver, a low-energy path would be provided for tunneling superconducting electrons.

Figure 4:
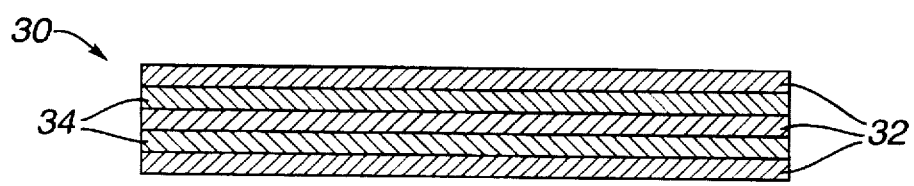
FIG. 4 is a cross-sectional view of another alternate embodiment of a multi-layer superconductor in accordance with the present invention.

Referring now to FIG. 4, another superconductor structure 30 is shown to include multiple superconductor layers 32 separated by multiple non-superconductor inter-layers 34. The non-superconductor inter-layers can be made from a variety of materials ranging from conductors to insulators. For example, the non-superconductor inter-layers 34 can be made from an adhesive, thereby holding adjacent pairs of superconductor layers 32 together. Alternatively, the non-superconductor inter-layers can be a conductor such as copper or silver, providing a low-energy path between adjacent superconductor layers 32, aiding in superconducting and non-superconducting electron flow between the layers.

Copper is a desirable inter-layer or via material because the currently known high $T_c$ ceramic superconductors are based on copper-oxides, and are therefore chemically compatible with copper. On the other hand, silver has the desirable property of being permeable to oxygen at the elevated temperatures at which the ceramic superconducting phase is formed, allowing the required oxygen to be absorbed into the lattice structure.

While the multi-layer superconductor structure has been discussed in terms of multiple planar layers, other geometries are also suitable to this invention. For example, multi-layer superconductor wires can be formed where the layers are concentrically formed around a core, with optional radial vias to enhance conductivity. Also, superconductor reflectors and lenses having non-planar surfaces can be designed using the multi-layer superconductor concept of this invention.

Once the problems solution, as described above, has been recognized, there are a number of methods to produce multi-layer superconductor structures which will become apparent to those skilled in the art. Several of such methods will be discussed below, with the understanding that other methods well known to those skilled in the art are also suitable.

Method #1

A first method for producing a multi-layer superconductor structure is to manufacture a number of superconductor layers, such as by the process already described above. The individual superconductor layers are then juxtaposed surface-to-surface, and are sintered together at elevated temperatures. Oxygen annealing of the superconductor structure may be required to increase its oxygen content after the sintering step.

As an alternative, the juxtaposed superconductor layers could be mechanically held together by applying a compressive force on the top and bottom layers. A variety of clamping arrangements or fastening structures could be used for this purpose.

Vias can be produced between the various layers by mechanical or laser drilling, and subsequent filling with superconductor material, which would be subsequently annealed to sinter the via material to the layer materials. Alternatively, conductor materials such as copper or silver could be used to fill the via holes, providing a low-energy tunneling path for the superconducting electrons.

Method #2

A second method for producing a multi-layer superconductor structure involves the sequential formation of superconductor layers, one over the next. There are a variety of suitable processes for this method, some of which will be briefly discussed.

One process for sequential layer formation includes the step of suspending powdered superconductor, or its precursors, in a fluid medium, and then applying the medium to a pre-formed superconductor layer or another suitable substrate such as <100> oriented $SrTiO_3$. The substrate and medium are fired to drive off any organics and to sinter the powdered superconductor to the upper surface of the substrate. This process is then repeated until the desired number of layers have been achieved.

There are also a number of deposition techniques which can be used to form multiple layers. For example, thin film techniques such as e-beam evaporation, sputtering, or co-evaporation can be used to form multiple thin-film layers. However, such deposition techniques tend to be epitaxial, i.e. the layers assume the crystal structure of the layers beneath it. If the layers are formed directly on top of one another, any crystal defects or non-superconducting domains would tend to be perpetuated through the layers. Therefore, if deposition techniques are used, intervening non-superconductor layers should be deposited to form a multi-layer sandwich of superconducting and non-superconducting layers, as exemplified in FIG. 4.

While this invention has been described in terms of several preferred embodiments, those skilled in the art will undoubtedly realize various alterations, permutations, and combinations thereof after reading the preceding descriptions and studying the drawing. It is therefore intended that the following appended claims be interpreted as defining the true spirit and scope of the present invention.

What is claimed is:

1. A method for producing a superconductor structure comprising:

preparing a first bulk ceramic superconductor having a first essentially random pattern of superconductor domains of a copper-oxide ceramic superconductor and non-superconductor domains at a temperature, said first bulk ceramic superconductor having a first surface;

preparing a second bulk ceramic superconductor having a second essentially random pattern of superconductor domains of a copper-oxide ceramic superconductor and non-superconductor domains at said temperature, said second bulk ceramic superconductor having a second surface;

juxtaposing said first surface and said second surface of said first bulk ceramic superconductor and said second bulk ceramic superconductor, respectively; and sintering together said first and second surfaces of said first bulk ceramic superconductor and said second bulk ceramic superconductor, respectively, such that a superconductor structure is produced;

whereby, when said superconductor structure is positioned with respect to a magnetic field comprising multiple flux lines such that a magnetic flux line of said magnetic field is not parallel to said first and second surfaces and such that said magnetic flux line penetrates through said one of said bulk ceramic superconductors due to its first essentially random pattern of superconductor domains and non-superconductor domains, that said flux line is reflected by a superconductor domain of the other bulk ceramic superconductor due to their differing essentially random patterns of superconductor domains and non-superconductor domains.

2. A method as recited in claim 1 further comprising forming via holes at least partially through said first bulk superconductor and said second bulk superconductor, and filling said via holes with a non-insulating material.

3. A method as recited in claim 1 further comprising forming at least one additional bulk superconductor in addition to said first bulk superconductor and said second bulk superconductor, said additional bulk superconductor having another essentially random pattern of superconductor and non-superconductor domains, and juxtaposing said at least one additional bulk superconductor proximate to at least one of said first bulk superconductor and said second bulk superconductor, said additional bulk superconductor forming a part of said superconductor structure.

4. A method as recited in claim 3 further comprising forming a non-superconductor layer between said additional bulk superconductor and at least one of said first bulk superconductor and said second bulk superconductor.

5. A method as recited in claim 4 further comprising forming via holes at least partially through said first bulk superconductor, said second bulk superconductor, and said non-superconductor layer, and filing said via holes with a non-insulating material.

6. A method as recited in claim 1 wherein said first bulk ceramic superconductor and said second bulk ceramic superconductor are disk shaped.

7. A method for making a ceramic superconductor structure comprising:

forming a first bulk ceramic superconductor of a copper-oxide superconductor with a first essentially random pattern of superconductor domains and non-superconductor domains;

forming a conductor over said first bulk ceramic superconductor, said conductor including at least one of copper and silver; and forming a second bulk ceramic superconductor of said copper-oxide superconductor over said conductor to form a sandwich structure, said second bulk ceramic superconductor having a second essentially random pattern of superconductor domains and non-superconductor domains that is different from said first pattern, whereby superconductor domains of said first bulk ceramic superconductor and said superconductor domains of said second bulk ceramic superconductor are aligned only by chance in a direction normal to said first surface and to said second surface due to said different first pattern and second pattern.

8. A method as recited in claim 7 wherein said first bulk superconductor and said second bulk superconductor are formed separately, and then later juxtaposed.

9. A method as recited in claim 7 wherein said first bulk superconductor is formed first, said conductor is formed second over said first bulk superconductor, and said second bulk superconductor is formed third over said conductor.

10. A method as recited in claim 7 further comprising forming vias between said first bulk ceramic superconductor and said second bulk ceramic superconductor.

11. A method for producing a superconductor structure comprising:

preparing a first bulk superconductor having a first essentially random pattern of copper-oxide superconductor and non-superconductor domains at a temperature and having a first surface;

preparing a second bulk superconductor having a second essentially random pattern of copper oxide superconductor and non-superconductor domains at said temperature and having a second surface; and mechanically and electrically coupling said first surface to said second surface by a process including at least one of sintering said first surface to said second surface and providing a conductive layer including a metal selected from the group consisting of copper and silver, such that said first surface faces said second surface, whereby superconductor domains of one of said first bulk superconductor and said second bulk superconductor can randomly cover at least some non-superconductor domains of the other of said first bulk superconductor and said second bulk superconductor due to differences in said different first essentially random pattern and second essentially random pattern;

whereby, when said superconductor structure is positioned with respect to a magnetic field comprising multiple flux lines such that a magnetic flux line of said magnetic field is not parallel to said first and second surfaces and such that said magnetic flux line penetrates through said one of said bulk ceramic superconductors due to its first essentially random pattern of superconductor domains and non-superconductor domains, that said flux line is reflected by a superconductor domain of the other bulk ceramic superconductor due to their differing essentially random patterns of superconductor domains and non-superconductor domains.

12. A method as recited in claim 11 further comprising providing a substrate to which at least a precursor of said bulk ceramic superconductor is applied.

13. A method as recited in claim 12 wherein said substrate comprises <100> oriented $SrTiO_3$.

14. A method as recited in claim 11 wherein said first bulk superconductor and said second bulk superconductor are disk shaped.

15. A method as recited in claim 11 wherein said first bulk ceramic superconductor and said second bulk ceramic superconductor are disk shaped.

16. A method for producing a superconductor assembly comprising:

preparing a first bulk ceramic superconductor having a first essentially random pattern of superconductor domains of a copper-oxide ceramic superconductor and non-superconductor domains at a critical temperature, said first bulk ceramic superconductor having a first surface and a second surface;

preparing a second bulk ceramic superconductor having a second essentially random pattern of superconductor domains of a copper-oxide ceramic superconductor and non-superconductor domains at said critical temperature, said second bulk ceramic superconductor having a first surface and a second surface; and juxtaposing said first surface of said first bulk ceramic superconductor proximate with said first surface of said second bulk ceramic superconductor to form a superconductor assembly where superconductor domains of said first bulk ceramic superconductor and superconductor domains of said second bulk ceramic superconductor are only randomly aligned due to said different first essentially random pattern and second essentially random pattern;

whereby, when said superconductor assembly is positioned with respect to a field such that a flux line of said field penetrates through said first bulk ceramic superconductor, that said flux line is be prevented from penetrating said second bulk ceramic superconductor.

17. A method as recited in claim 16 further comprising fixing the juxtaposed position of said first bulk ceramic superconductor and said second bulk ceramic superconductor such that said superconductor assembly is moved as a unit.

18. A method as recited in claim 17 further comprising cooling said superconductor assembly to said critical temperature such that superconductor domains of said superconductor structure are superconducting.

19. A method as recited in claim 18 further comprising moving said superconductor assembly relative to an object affected by said superconductor assembly.

20. A method as recited in claim 17 wherein said fixing the juxtaposed position includes mechanically fixing said first bulk ceramic superconductor relative to said second bulk ceramic superconductor.

21. A method as recited in claim 17 wherein said fixing the juxtaposed position includes sintering said first bulk ceramic superconductor to said second bulk ceramic superconductor.

22. A method as recited in claim 17 wherein said fixing the juxtaposed position includes providing a bonding between said first bulk ceramic superconductor to said second bulk ceramic superconductor.

23. A method as recited in claim 22 wherein said bonding is an adhesive layer.

24. A method as recited in claim 22 wherein said bonding is a conductive layer.

25. A method as recited in claim 24 wherein said conductive layer includes at least one of silver and copper.

26. A method as recited in claim 22 wherein said bonding is a non-conductive layer.

27. A method as recited in claim 26 wherein said non-conductive layer is an adhesive layer.

28. A method as recited in claim 16 further comprising:

preparing a third bulk ceramic superconductor having a first surface and having a third essentially random pattern of superconductor domains of a copper-oxide ceramic superconductor and non-superconductor domains at said critical temperature; and juxtaposing said first surface of said third bulk ceramic superconductor proximate to said second surface of said second bulk ceramic superconductor to form a part of said superconductor assembly where superconductor domains of said first bulk ceramic superconductor, superconductor domains of said second bulk ceramic superconductor, and superconductor domains of said third bulk ceramic superconductor are only randomly aligned due to said different first essentially random pattern, second essentially random pattern, and said third essentially random pattern.

* * * * *